350-311. SR 05-09-72 XR 3,661,436

[15] 3,661,436

Horwath et al.

[45] May 9, 1972

[54] TRANSPARENT FABRICATION MASKS UTILIZING MASKING MATERIAL SELECTED FROM THE GROUP CONSISTING OF SPINELS, PEROVSKITES, GARNETS, FLUORIDES AND OXY-FLUORIDES

[72] Inventors: Ronald S. Horwath, Salt Point; Varadachari Sadagopan, Ossining, both of N.Y.

[73] Assignee: International Business Machines Corporation, Armonk, N.Y.

[22] Filed: June 30, 1970

[21] Appl. No.: 51,237

[52] U.S. Cl. ..................................350/1, 96/36.2, 117/33.3, 117/212, 350/311, 350/316, 350/317

[51] Int. Cl. ..........................................................G02b 5/20

[58] Field of Search ..............350/1, 311, 316, 317; 117/212, 117/33.3, 38; 96/36.2

[56] References Cited

UNITED STATES PATENTS

| | | | |
|---|---|---|---|
| 3,510,371 | 5/1970 | Frankson | 96/36.2 X |
| 3,498,833 | 3/1970 | Lehrer | 117/212 |
| 3,135,823 | 6/1964 | Pritikin | 96/36.2 X |
| 3,508,982 | 4/1970 | Shearin | 96/36.2 X |

*Primary Examiner*—David Schonberg
*Assistant Examiner*—Toby H. Kusmer
*Attorney*—Hanifin and Jancin and Jackson E. Stanland

[57] ABSTRACT

A mask for the manufacture of semiconductor and other very small components. The mask is comprised of patterns of multi-component oxides and fluorides, such as spinels, perovskites, and garnets. In general, the materials are harder than the components being manufactured and are opaque to the wavelength used in photoresist techniques, while being transparent to the visible wavelengths. Materials with an energy gap between approximately 2.8 eV and 5 eV satisfy these optical properties, a particular example being $GaFeO_3$. These masks are not damaged by surface defects on the components and can be visually aligned.

16 Claims, 11 Drawing Figures

INVENTORS
RONALD S. HORWATH
VARADACHARI SADAGOPAN

BY
AGENT

TRANSPARENT FABRICATION MASKS UTILIZING MASKING MATERIAL SELECTED FROM THE GROUP CONSISTING OF SPINELS, PEROVSKITES, GARNETS, FLUORIDES AND OXY-FLUORIDES

BACKGROUND OF THE INVENTION

1. Field of the Invention

This invention relates to a fabrication mask for the production of small components, and more particularly to masks which are wear resistant and capable of being visually aligned during fabrication of these small components.

2. Description of the Prior Art

In the fabrication of small components, and particularly semiconductor components, masks are extensively used. For instance, such masks enable the definition of precise patterns of vary small size on a semiconductor wafer. However, it is at present very difficult to produce micron and submicron components with existing mask techniques.

In many semiconductor processes, a wafer of semiconductor material is coated with a layer of photoresist, after which a mask is brought into contact with the photoresist layer. Light of a particular wavelength (usually ultraviolet) will pass through the mask openings and will expose the photoresist in those portions uncovered by the mask. After development, the wafer is etched in the developed locations. If desired, further process steps, such as diffusion or evaporation of another material, are then done.

In the sample process above, it is very important that the mask be properly aligned and that it defines the very small dimensions required. Further, the mask must be used numerous times and therefore must be wear resistant. During the fabrication processes, the mask must be continually moved. Therefore, real time alignment is required in order to obtain high device yield.

Existing masks, such as chromium-on-glass, cadmium sulfide, and photographic emulsion masks, do not meet these requirements. For instance, the chromium masks are not transparent to visible light, and alignment problems are difficult. Usually, markers are used to position the masks during the fabrication steps, although this leads to inaccuracies and a resultant low fabrication yield.

Chromium-on-glass masks can be damaged by surface imperfections on the underlying semiconductor. For instance, the spikes which are formed during epitaxial deposition are large and may seriously damage the mask when it is placed in contact with the semiconductor surface. Since the mask is generally much more expensive than the underlying semiconductor wafers, this damage represents a serious and costly problem.

Even if transparent masks are used, the presently known masks of this type are comprised of very soft material, such as photographic emulsions and cadmium sulfide. These masks are easily damaged by surface imperfections and have very short lifetimes.

Accordingly, it is a primary object of this invention to provide a mask which is suitable for the fabrication of micron and submicron devices.

Another object of this invention is to provide a fabrication mask which can be visually aligned during component manufacture.

Still another object of this invention is to provide an improved mask which has long lifetime and which can be used on surfaces having imperfections.

A further object of this invention is to provide a mask which does not require a supporting substrate.

A still further object of this invention is to provide an improved mask which has good edge resolution.

BRIEF SUMMARY OF THE INVENTION

This mask can be used in the manufacture of micron and submicron components and is particularly suited to the manufacture of semiconductor components. The mask is comprised of a substrate and a patterned layer comprising complex multicomponent oxide or fluoride compounds. If desired, the mask can be fabricated of bulk crystals, without the need of a substrate.

Contrary to prior art masks, this mask utilizes materials such as spinels, perovskites, and garnets. The materials chosen are harder than the components produced with them, and therefore are not subject to damage due to surface imperfections on the components. For instance, in the fabrication of many semiconductor devices, large spike-like protrusions form on the surface. When a mask is brought into contact with the component surface, these spikes damage the mask and limit mask lifetime. The masks of the subject invention are harder than most materials used in semiconductor wafers (such as silicon) and are therefore not damaged by the spike-like imperfections.

To be compatible with conventional photoresist fabrication techniques, these mask materials are transparent to visible wavelengths and opaque to ultraviolet wavelengths. Ultraviolet wavelengths are those which are most commonly used to expose photoresist. The spinels, perovskites, and garnets are those materials which have an energy gap between 2.8 and 5.0 eV. A particularly good example is gallium iron oxide ($GaFeO_3$).

Due to the fact that the materials chosen are transparent to the visible range of wavelengths, the masks can be aligned in real time throughout the fabrication process. This eliminates the alignment problems which severely limit present day processes. In addition, these materials are easily etched and provide good edge acuity.

Although these materials have existed for many years, no one has recognized that they could be suitable (or advantageous) in the manufacture of semiconductor masks, even though the mask problems have been known for many years. This invention recognizes that these materials are transparent to visible wavelengths and opaque to ultraviolet wavelengths, and in addition are etchable. Also, they have the desirable property of high hardness and abrasion resistance. Applicants have applied these unique properties in a combination which solves many of the problems existing in present mask devices.

The foregoing and other objects, features and advantages of the invention will be apparent from the following more particular description of the preferred embodiments of the invention as illustrated in the accompanying drawing.

DESCRIPTION OF THE PREFERRED EMBODIMENTS

Figure 3:
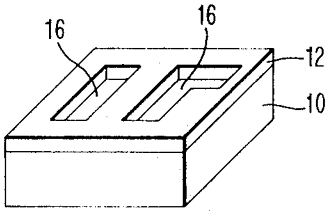
FIG. 3 is an illustration of a mask in which a thin film of masking material has etched holes therein.

FIGS. 1A–1D illustrate one method for forming a mask according to this invention. The final mask configuration comprises a thin film of masking material located on a substrate, wherein there are patterned holes in the masking material. That is, the final structure is similar to that shown in FIG. 3.

Figure 1A:
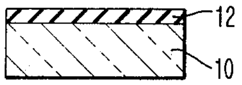
FIGS. 1A–1D illustrate a method for making a mask whose final structure is similar to that of FIG. 3.

In FIG. 1A, a substrate, 10, which is transparent in the ultraviolet and visible region, is coated on one surface by a thin film of masking material 12. The substrate can be, for instance, glass, quartz, sapphire, etc. The substrate is any material which is transparent to ultraviolet and visible radiation.

The masking material 12 is a complex oxide, fluoride, or oxy-fluoride. The materials which are most suitable are those which are transparent to visible radiation and opaque to ultraviolet radiation. Materials which have energy gaps between about 2.8 – 5 eV will satisfy this criterion. In general, the materials are chosen to be in the spinel, perovskite, and garnet groups. The spinels are characterized by the formula $AB_2O_4$. A suitable example is, for instance $MgFe_2O_4$. The perovskites, of which $BaTiO_3$ is an example, are characterized by the formula $ABO_3$. The garnets have the general formula $A_3B_5O_{12}$. Yttrium iron garnet (YIG), represented by the formula $Y_3Fe_5O_{12}$ is an example.

Many fluorides are also suitable. Examples of these include lanthium fluoride, $LaF_3$, and cerium fluoride, $CeF_3$. In general, the rare earth fluorides will be suitable. Oxy-fluorides are also suitable materials for the masking layer. An example is lanthium oxy-fluoride, LaOF. Again, the rare earth oxy-fluorides seem most suitable.

The masking layer 12 can be applied to the substrate 10 in a number of ways. For instance, r.f. sputtering is suitable for depositing gallium iron oxide ($GaFeO_3$). Typical operating conditions are the following:

Argon Pressure — approximately 10 $\mu$
Power Input — approximately 1.4 watts/cm$^2$
Electrode voltage — approximately 1500 V peak-to-peak at 13.56 Hz
Base pressure — approximately $1 \times 10^{-7}$ Torr.
Substrate temperature — water cooled
Substrate — fused quartz, sapphire, etc.
Deposition Rate — approximately 0.5 A./sec.

The sputtering is done conventionally using a powder target. It is also possible to use spray techniques or spinning techniques to produce the masking layer. In general, any ceramic deposition technique for growing continuous films can be used.

The thickness of the masking layer 12 is sufficient to produce continuous films. If the films are continuous, they will be opaque to ultraviolet light, which is commonly used to expose photoresist during semiconductor component fabrication. For $GaFeO_3$, films from 500 angstroms to 2, 3 microns are suitable. In a particular example, a 3,000 angstrom film was used with good results.

Since the masking material 12 is etchable, a thicker layer can be grown and then etched to the desired thickness. For instance, $GaFeO_3$ films are etchable in dilute HCl. This acid is compatible with conventionally used photoresist and does not attack $SiO_2$ or other silicon-based glasses. This means that $GaFeO_3$ is particularly suitable for use with silicon technology.

Figure 1B:
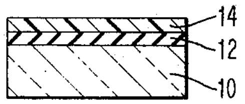

In FIG. 1B, a thin layer of photoresist 14 is deposited on the masking layer 12. The thickness of the photoresist layer is not critical. It is only important that its full thickness be exposable with radiation, most generally ultraviolet radiation.

Figure 1D:
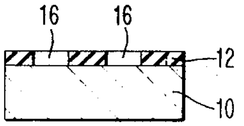

The photoresist is selectively exposed with ultraviolet light and then the exposed regions are dissolved using a suitable solvent, such as 9 percent hydrochloric acid in a clear solution. This particular solvent also etches $GaFeO_3$, and therefore the resulting mask is that of FIG. 1C. After removal of the photoresist 14 and the masking layer 12 in selected regions 16, the remaining unexposed photoresist is removed, leaving the final mask structure as shown in FIG. 1D. The final structure consists of substrate 10 and a masking layer 12 which has selectively etched holes 16 therein. This structure is that of FIG. 3. Here, it is seen that the mask has a pattern of geometrically arranged openings 16 in the masking layer 12. This mask can now be used for component processing, including semiconductor fabrication.

Another suitable method for making a mask is shown in FIGS. 2A–2D. In this method, openings will be provided in a substrate, into which is deposited the masking material. This structure (FIG. 4) is in distinction with that of FIG. 3, in which an external layer of masking material 12 has etched openings 16 in it.

Figure 2A:
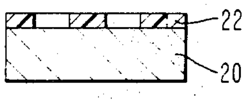
FIGS. 2A–2D illustrate a method for making a mask whose final structure is similar to that of FIG. 4.

In FIG. 2A, the substrate 30 has a pattern of photoresist 22 on its top surface. The photoresist pattern 22 is produced in conventional ways, as by uniformly coating the surface with photoresist and then developing selected regions. The selected regions are then dissolved away leaving a pattern similar to that shown in FIG. 2A.

In FIGS. 2A–2D, the substrate materials and dimensions are similar to those in the embodiment of FIGS. 1A–1D, and FIG. 3.

Figure 2B:
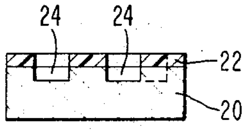
Figure 1C:
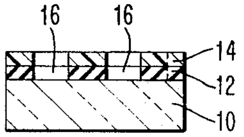
Figure 2C:
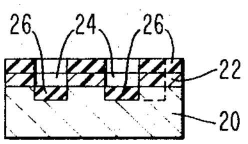
Figure 2D:
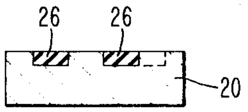

In FIG. 2B regions are etched into the exposed surface portions of the substrate 20. The masking material 26 is then deposited into the etched regions 24 and into photoresist 22 (FIG. 2C). After this, the photoresist (and its overlying masking material) is dissolved away, leaving the structure of FIG. 2D. The thickness of the masking material in the etched regions is the dame as that for the masking layer of FIG. 3. That is, the masking regions 26 in FIG. 2D are opaque to ultraviolet light and transparent to visible light.

Figure 4:
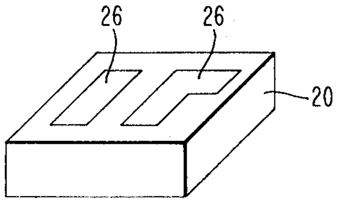
FIG. 4 is an illustration of a mask in which the masking material is located in buried regions near the substrate surface.

A possible final configuration of the masks produced by the method shown in FIGS. 2A–2D is illustrated by FIG. 4. Here, the substrate 20 has buried masking material 26 which forms a geometric pattern. This mask can be placed onto a surface and used for component fabrication where photoresist techniques are employed.

This mask can be fabricated by other techniques than those described previously. An alternate technique would be to use an electron beam to fabricate a master mask. Further masks would be made from this master mask by techniques such as those described with reference to FIGS. 1A–1D and FIGS. 2A–3D. This would result in a mask with very high resolution.

Another suitable technique for making a mask would be that of projection masking. Here, a large mask is initially manufactured and then is reduced onto photoresist in order to get successively smaller masks. That is, each mask is imaged onto photoresist through a reducing lens in order to provide successively smaller masks.

$GaFeO_3$ and other spinels, perovskites, and garnets, together with the fluorides and oxy-fluorides, are materials which are easily adopted for projection masking and electron beam exposure techniques which are conventionally well-known. By the use of these techniques, it is possible to obtain sub-micron structures with good edge definitions. Such masks in turn are used to make fine structures on semiconductors, such as silicon devices. Since these materials are harder than silicon and other commonly used semiconductors, the masks will have long lifetimes. This is important economically, since the cost of masks is sufficiently greater than that of the underlying semiconductor wafers.

In defining the geometric pattern of the mask, conventional techniques such as projection masking can be used. Since the resolution obtainable depends upon the wavelength of the light used to expose the photoresist, electron beam fabrication techniques will produce the smallest mask patterns. Many photoresists can be exposed by electron beam techniques and, if these photoresists are used in making the masks, it will be possible to produce submicron geometric patterns.

Projection masking is another technique for producing the mask geometries. In this technique, an image of the desired pattern is projected onto the photoresist covered masking layer by means of a high resolution lens. If a high quality lens is used, an entire 1 inch wafer can be exposed, giving patterns as small as 2.5 microns. If a high quality microscopic lens is used, patterns as small as 0.5 micron can be produced on an area of approximately $0.5 \times 0.5$ millimeters.

Figure 5:
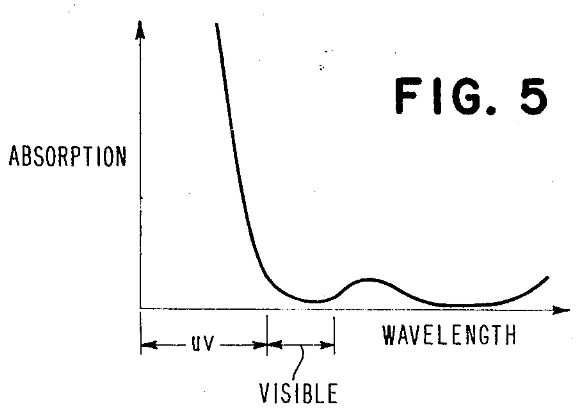
FIG. 5 is a plot of absorption versus wavelength for $GaFeO_3$, a representative masking material.

FIG. 5 is a plot of absorption as a function of wavelength for a masking material, such as $GaFeO_3$. The material has a high absorption to the wavelength used to expose photoresist used in fabricating components, and is transparent to the visible wavelengths. This allows visual alignment continually during fabrication of components.

Present photoresist technology generally employs a wavelength of approximately 4353 angstroms in the ultraviolet range. For this wavelength, masking materials should have an absorption edge around approximately 2.8 ev. If the energy gap of the masking material is much greater than 2.8 ev, the masking material will be transparent in the ultraviolet. On the other hand, if the energy gap is much less than 2.8 ev, transparency in the visible range may be affected. Hence, the masking materials are chosen to have a band gap between 2.8 and 5eV, approximately.

What has been described is a mask using materials which have not heretofore been suggested for use in this manner. These masks combine the features of high hardness, a capability for continual visual alignment, and compatibility with present day photoresist techniques to produce a mask which is superior to those presently used. The materials used to fabricate the masks comprise spinels, perovskites, garnets, fluorides and oxy-fluorides. In particular, $GaFeO_3$ is a very suitable material to be used during the production of silicon semiconductor devices. In contrast with the previously used metal mask, these masks utilize insulating oxides. If the masking material is doped, the energy gap will be lessened and the optical properties of the materials will be affected. Generally, it is advantageous to use the masking materials as insulators since this provides the correct optical properties.

What is claimed is:

1. A mask suitable for use in the fabrication of components by processes utilizing radiation, comprising:
   a medium transparent to said radiation and to visible light;
   a masking material located on said supporting medium, said masking material being continuous and pinhole free, and having a geometric pattern useful in said fabrication process, wherein said masking material has an energy gap between 2.8eV and 5.0eV and is selected from the group consisting of spinels, perovskites, garnets, fluorides, and oxy-fluorides.

2. The mask of claim 1 wherein said masking material has a thickness between approximately 500 angstroms and 3 microns.

3. The mask of claim 1, where said masking material is a layer supported by said medium, said layer having holes etched in it which extend substantially to said medium.

4. The mask of claim 1 wherein said masking material is buried in regions in said medium.

5. A mask suitable for use in device manufacturing processes wherein ultraviolet radiation is used, said mask being a medium which is continuous and pin hole free and having first regions of lesser thickness which are opaque to said radiation and transparent to visible light and second regions which are of greater thickness and are opaque to visible light and to said radiation, said first and second regions defining a geometric pattern, and wherein said masking medium is chosen from the group consisting of spinels, perovskites, fluorides, and oxy-fluorides.

6. The mask of claim 5, where the masking material is $GaFeO_3$.

7. A mask for use in the production of components by photoresist techniques wherein ultraviolet radiation is used to expose said photoresist comprising: a first medium which is transparent to said radiation and to visible wavelengths;
   a second medium opaque to said ultraviolet radiation and transparent to said visible wavelengths formed in a pattern on said first medium, said second medium being continuous and pin hole free and defining the desired mask pattern, said second medium being chosen from the group consisting of spinels, perovskites, garnets, fluorides, and oxy-fluorides.

8. The mask of claim 4, wherein said second medium is a layer on said first medium having apertures therein, said apertured layer defining said mask pattern.

9. The mask of claim 4, wherein said second medium is located in regions of said first medium, said regions defining said masked pattern.

10. The mask of claim 4, wherein said second medium is 500 angstroms to 3 microns in thickness.

11. A mask used in device fabrication processes, comprising:
   a first medium which is transparent to both visible and ultraviolet radiation;
   a second medium on said first medium, said second medium comprising continuous, pin hole free regions of $GaFeO_3$, said $GaFeO_3$ regions forming the desired mask pattern and having a thickness between 500 angstroms and 3 microns.

12. A mask of claim 11, wherein said regions are located in portions of said first medium and are transparent to visible radiation while being opaque to ultra-violet radiation.

13. A mask of claim 11, wherein said regions are portions of a continuous film of $GaFeO_3$ having apertures therein, said $GaFeO_3$ being opaque to ultra-violet light and transparent to visible radiation.

14. A mask suitable for use in the fabrication of components by processes utilizing radiation, comprising:
   a medium transparent to said radiation and to visible light,
   a masking material located on said supporting medium, said masking material being continuous and pinhole free and having a geometric pattern useful in said fabrication process, said masking material having an energy gap between 8eV and 5.0eV and being selected from the group consisting of spinels, perovskites, garnets, rare earth fluorides, and rare earth oxy-fluorides.

15. A mask suitable for use in the fabrication of components by processes utilizing radiation, comprising:
   a medium transparent to said radiation and to visible light;
   a masking material located on said supporting medium, said masking material being continuous and pinhole free and having a geometric pattern useful in said fabrication process, said masking material being comprised of $GaFeO_3$ having an energy gap between 2.8eV and 5.0eV and a thickness between approximately 500 angstroms and 3 microns.

16. A mask for use in the production of components by photoresist techniques wherein radiation is used to expose said photoresist, comprising:
   a first medium which is transparent to said radiation and to visible wavelengths;
   a second medium formed in a pattern on said first medium, said second medium being continuous and pin hole free and defining the desired mask pattern, where said second medium is chosen from the group consisting of spinels, perovskites, fluorides, and oxy-fluorides, said materials being selected from the group consisting of $GaFeO_3$, $MgFe_2O_4$, YIG, $LaF_3$, $CeF_3$, and LaOF.

* * * * *